(12) United States Patent
Tseng

(10) Patent No.: US 8,669,022 B2
(45) Date of Patent: Mar. 11, 2014

(54) PHOTOMASK

(76) Inventor: Yao-Ching Tseng, Taichung (TW)

( * ) Notice: Subject to any disclaimer, the term of this patent is extended or adjusted under 35 U.S.C. 154(b) by 192 days.

(21) Appl. No.: 13/284,638

(22) Filed: Oct. 28, 2011

(65) Prior Publication Data

US 2012/0107731 A1   May 3, 2012

(30) Foreign Application Priority Data

Nov. 1, 2010 (TW) .............................. 99137455 A
Nov. 17, 2010 (TW) .............................. 99139495 A

(51) Int. Cl.
*G03F 1/00* (2012.01)

(52) U.S. Cl.
USPC .............................................. 430/5; 430/394

(58) Field of Classification Search
USPC .................. 430/5, 30, 311, 312, 394
See application file for complete search history.

(56) References Cited

U.S. PATENT DOCUMENTS

| 6,013,395 | A  | * | 1/2000 | Matsuura | 430/5 |
| 7,939,229 | B2 | * | 5/2011 | Sera et al. | 430/5 |
| 2004/0241555 | A1 | * | 12/2004 | Sheu | 430/5 |
| 2008/0090157 | A1 | * | 4/2008 | Chung et al. | 430/5 |
| 2008/0102379 | A1 | * | 5/2008 | Wu et al. | 430/5 |
| 2009/0075182 | A1 | * | 3/2009 | Shimizu et al. | 430/5 |
| 2009/0176325 | A1 | * | 7/2009 | Jeon et al. | 438/34 |

* cited by examiner

*Primary Examiner* — Stephen Rosasco
(74) *Attorney, Agent, or Firm* — Ding Yu Tan

(57) ABSTRACT

A photomask includes a transparent substrate for passage of an exposure light, and a plurality of photomask pattern units formed on a surface of the transparent substrate. Each of the photomask pattern units includes a first light-blocking layer connected to the surface of the transparent substrate, and a second light-blocking layer formed on a surface of the first light-blocking layer opposite to the transparent substrate. The first and second light-blocking layers block the exposure light, or permit passage of light energy lower than threshold energy of photoresist on the substrate.

9 Claims, 12 Drawing Sheets

PHOTOMASK

CROSS-REFERENCE TO RELATED APPLICATIONS

This application claims priority of Taiwanese application nos. 099137455 and 099139495 respectively filed on Nov. 1 and 17, 2010.

BACKGROUND OF THE INVENTION

1. Field of the Invention

The present invention relates to a photomask, more particularly to a photomask that can improve the level of process tolerance and compensate for micro-regional defocus effect on a wafer.

2. Description of the Related Art

With increase of the density of circuit components of electronic products, semiconductor lithography technique has been developed to meet the requirement of production of finer images. Increasing the depth of focus (DOF) so as to increase lithography process window facilitates reduction of reproducibility and yield loss. Improvement in resolution is an important subject in lithography techniques. There are many ways to improve the resolution, for example, employing a lens with a larger numerical aperture, or employing an exposure light with a shorter wavelength, e.g., deep ultraviolet KrF (wavelength=248 nm) and ArF (wavelength=193 nm) used to replace conventional I-line (wavelength=365 nm). In addition, the resolution may be enhanced by, for example, a phase shift masking technique, an off-axis illumination technique, and the like.

Generally, in the manufacturing process of semiconductor elements, a plurality of masking steps are required to pattern a photoresist layer on a wafer so as to form, e.g. a mask used in an etching or ion implantation step. Referring to FIG. 1, a conventional binary mask 1 with different wiring densities comprises a glass substrate 11 and a predetermined pattern 12. The predetermined pattern 12 comprises a plurality of spaced apart chromium light-blocking layers 121 having a substantially identical thickness, a plurality of light transmissive regions 122A, 122B each of which is definedby two adjacent ones of the light-blocking layers 121 and in which the light transmissive regions 122B have a larger width than that of the light transmissive regions 122A, and a plurality of anti-reflection layers 123 each of which is formed on a surface of the corresponding one of the light-blocking layers 121 opposite to the substrate 11. After the predetermined pattern 12 is formed on the glass substrate 11, the predetermined pattern 12 may be transferred to the photoresist layer on the wafer via an exposure process. The exposed photoresist layer is then subjected to post exposure baking, developing, and etching steps to form a specific wiring structure. An image of the predetermined pattern 12 on the mask 1 is formed on a focal plane on the opposite side of the lens when the exposure light radiates the predetermined pattern 12. When the focal plane overlaps with an optimum photoresist plane, a photoresist pattern with the optimum resolution can thus be obtained. However, when the exposure light passes through the light transmissive regions 122A, 122B with different widths (i.e., different wiring densities) and radiates the photoresist, the photoresist layer will produce different concentrations of acid cation on the focal plane due to the poor quality of the focal lens or the different wiring densities of the mask 1. Therefore, when the photoresist layer is subjected to a subsequent process such as the post exposure baking, due to the diffusion difference of the acid cation, the photoresist pattern formed with different wiring densities may have problems e.g., incomplete development, over development, undercut or the like, which results in a resolution problem. On the other hand, since the thickness of the photoresist layer on the wafer may not be uniform due to the uneven wafer surface, and the exposure light passing through the mask which is formed with the chromium light-blocking layers 121 having a substantially identical thickness may focus on a same horizontal plane of the photoresist layer after the exposure process, for the photoresist layer with different thicknesses, the photoresist pattern thus formed is liable to have a non-uniform resolution problem or focal depth variation or defocus effect when the mask 1 is aligned with the photoresist layer, thereby causing unqualified critical dimension, poor line edge roughness, or inferior cross sectional profile of the photoresist pattern. It is understood that exposure amount and focusing control are important parameters for the distribution quality of the photoresist pattern on the wafer, and the defocus problem may usually result in reduced process window and increased difficulty in the process. The defocus problem during the light exposure process is attributed to the following defocus factors: lens aberration, vibration during the exposure process, inclination of the wafer or mask on a platform, or the non-uniform flatness of a wiring layer on the wafer.

To solve the defocus problem, conventionally, one solution is to improve the lithography equipment, and another is to build up a system that is capable of instantly detecting and feedback correcting the defocus factors. In addition, in the present semiconductor manufacturing process, before performing the lithography exposure process, a product wafer is selected to perform the measurement of the focus-exposure matrices so as to decide the optimum process focus value. However, it is still desired to provide a better way to improve the poor development resolution due to the wiring density difference or non-uniform flatness of structure on the same chip or to compensate the micro-regional defocus effect.

SUMMARY OF THE INVENTION

Therefore, the object of the present invention is to provide a photomask that can overcome the aforesaid drawbacks of the prior art.

According to one aspect of the present invention, there is provided a photomask which can form different focal planes on a substrate when an exposure light passes through the photomask and which can compensate for a defocus effect resulting from uneven surface height of the substrate. The photomask comprises: a transparent substrate for passage of an exposure light; and a plurality of photomask pattern units formed on a surface of the transparent substrate, and each including a first light-blocking layer connected to the surface of the transparent substrate, and a second light-blocking layer formed on a surface of the first light-blocking layer opposite to the transparent substrate. The first and second light-blocking layers block the exposure light, or permit passage of light energy lower than threshold energy of photoresist on the substrate.

According to another aspect of the present invention, there is provided a photomask for providing a photoresist layer disposed on a substrate with a predetermined photoresist pattern upon light exposure. The photoresist pattern has at least one first wiring region and at least one second wiring region. The first wiring region is larger in wiring density than the second wiring region. The photomask is capable of forming different focal planes in the photoresist layer upon light exposure to compensate for uneven resolution resulting from non-uniform density of the photoresist pattern and to improve an exposure process tolerance level. The photomask comprises: a transparent substrate; at least one first photomask pattern unit disposed on a surface of the transparent substrate for forming the first wiring region, and including a plurality of first light-blocking regions for blocking exposure light or for permitting passage of light energy lower than threshold energy of the photoresist layer, and a plurality of first light transmissive regions alternating with the first light-blocking regions for passage of exposure light; and at least one second photomask pattern unit disposed on a surface of the transparent substrate corresponding in position to the second wiring region, and including a plurality of second light-blocking regions for blocking exposure light or for permitting passage of light energy lower than threshold energy of the photoresist layer, and a plurality of second light transmissive regions alternating with the second light-blocking regions for passage of exposure light. The first and second light-blocking regions differ in thickness.

According to still another aspect of the present invention, there is provided a photomask for providing a photoresist layer disposed on a photoresist substrate with a predetermined photoresist pattern upon light exposure. The substrate has first and second regions formed from different materials. The photomask is capable of forming different focal planes in the photoresist layer upon light exposure to compensate for defects resulting from the different materials of the photoresist substrate and to improve an exposure process tolerance level. The photomask comprises: a transparent photomask substrate; at least one first photomask pattern unit disposed on a surface of the transparent substrate corresponding in position to the first region of the substrate for forming a first wiring region, and including a plurality of first light-blocking regions for blocking exposure light or for permitting passage of light energy lower than threshold energy of the photoresist layer, and a plurality of first light transmissive regions alternating with the first light-blocking regions for passage of exposure light; and at least one second photomask pattern unit disposed on a surface of the transparent substrate corresponding in position to a second region of the substrate for forming a second wiring region, and including a plurality of second light-blocking regions for blocking exposure light or for permitting passage of light energy lower than threshold energy of the photoresist layer, and a plurality of second light transmissive regions alternating with the second light-blocking regions for passage of exposure light. The first and second light-blocking regions differ in thickness.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
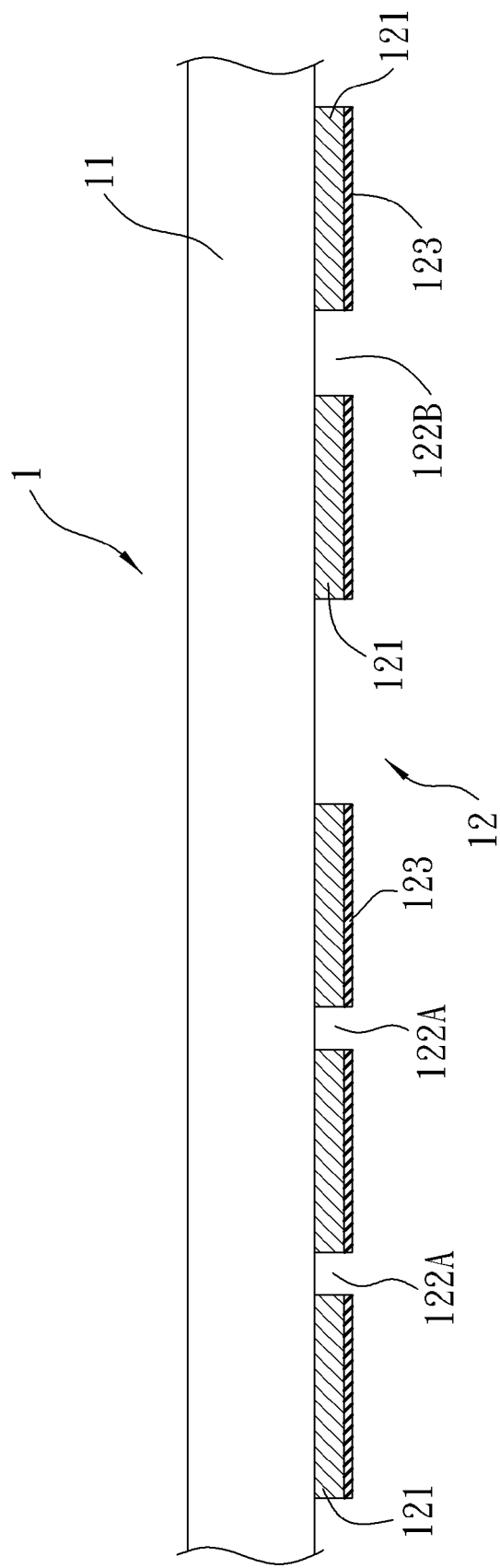
FIG. 1 is a fragmentary partly sectional view of a conventional binary mask.

Before the present invention is described in greater detail, it should be noted that like components are assigned the same reference numerals throughout the following disclosure.

Figure 2:
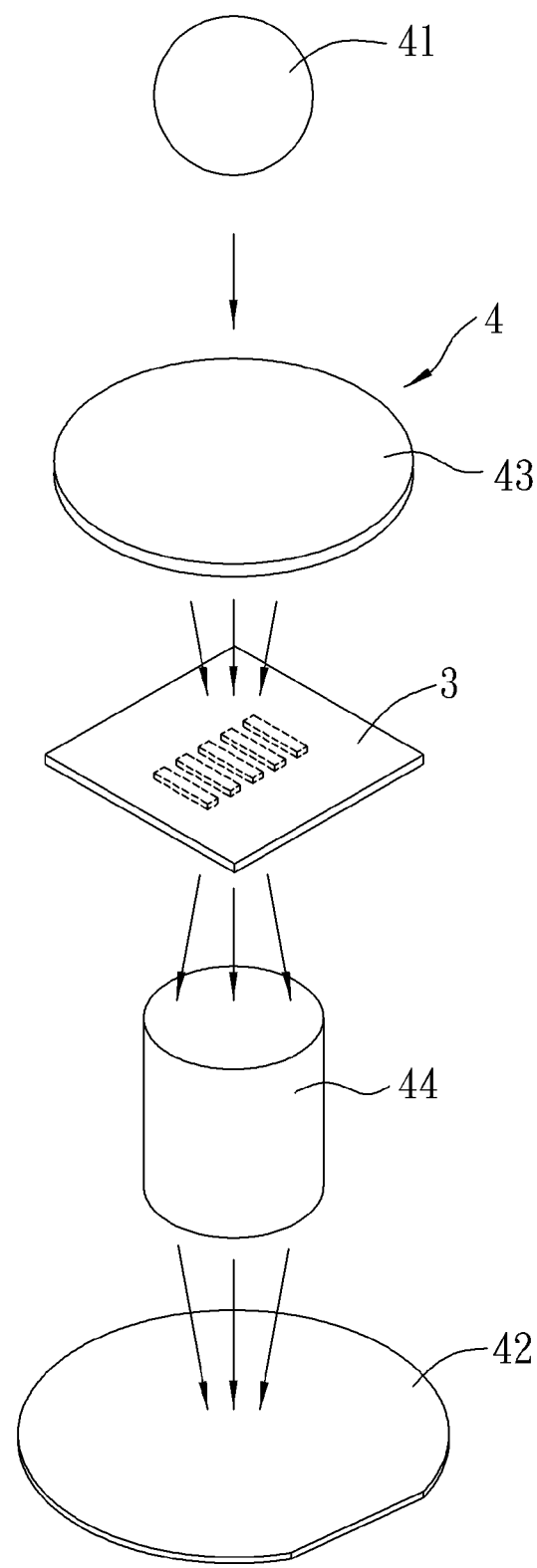
FIG. 2 is a perspective view illustrating a photomask of the present invention disposed in a lithography exposure system.

Referring to FIG. 2, a photomask 3 of the present invention can be a mask for scale down projective exposure, which can transfer a wiring pattern on the photomask 3 onto a wafer 42 at a ratio of 5:1 or 4:1 in a downsizing manner. More specifically, the photomask 3 is disposed in a lithography exposure system 4 and radiated by an exposure light source 41, so that a predetermined region on the wafer 42, which is applied with a photoresist, is exposed to light so as to subsequently define a circuit structure. The exposure light source 41 may emit deep ultraviolet having a wavelength of 248 nm or 193 nm, or extreme deep ultraviolet. The lithography exposure system 4 is a stepper or a scan stepper, and includes a condenser lens 43 that transmitting the exposure light source 41 onto the photomask 3, and an objective lens 44 that forms an image of the photomask pattern on the wafer 42. In the embodiments described hereinafter, patterns on the photomask 3 are transferred to the wafer 42 at a ratio of 4:1 in a downsizing manner.

Figure 3:
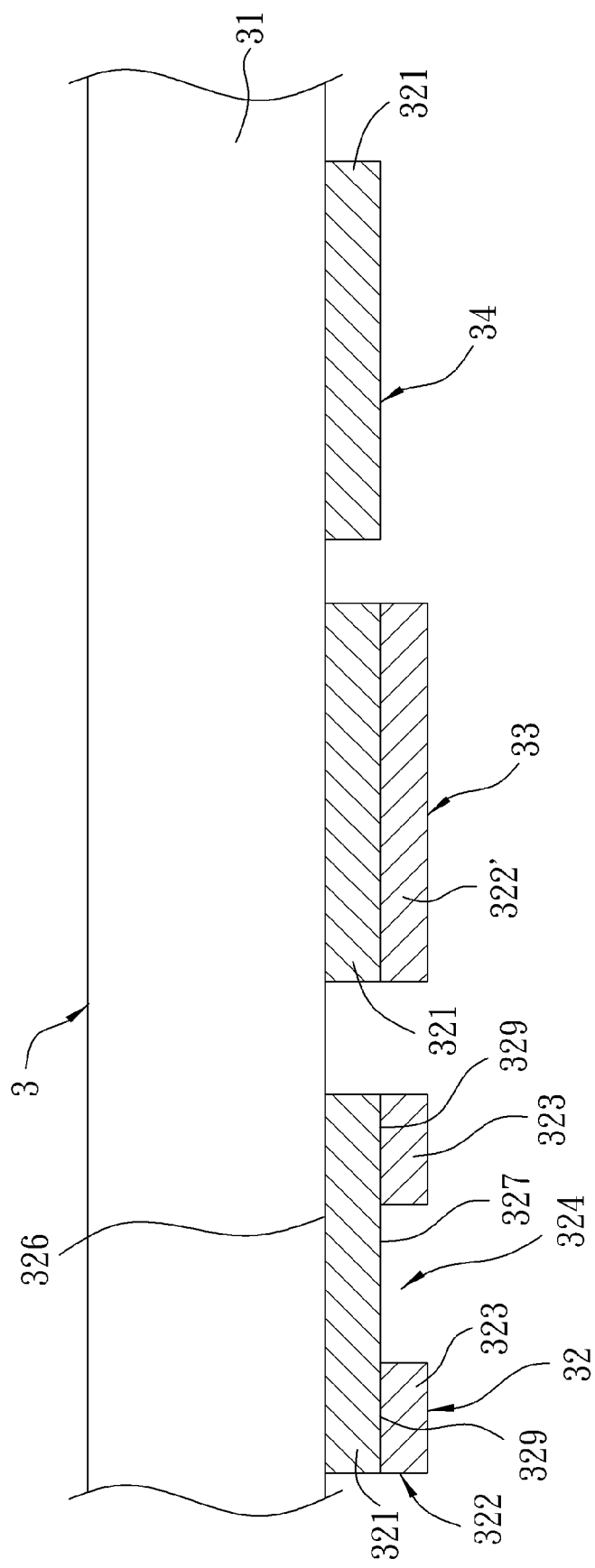
FIG. 3 is a fragmentary partly sectional view of the first preferred embodiment of a photomask according to the present invention.
Figure 4:
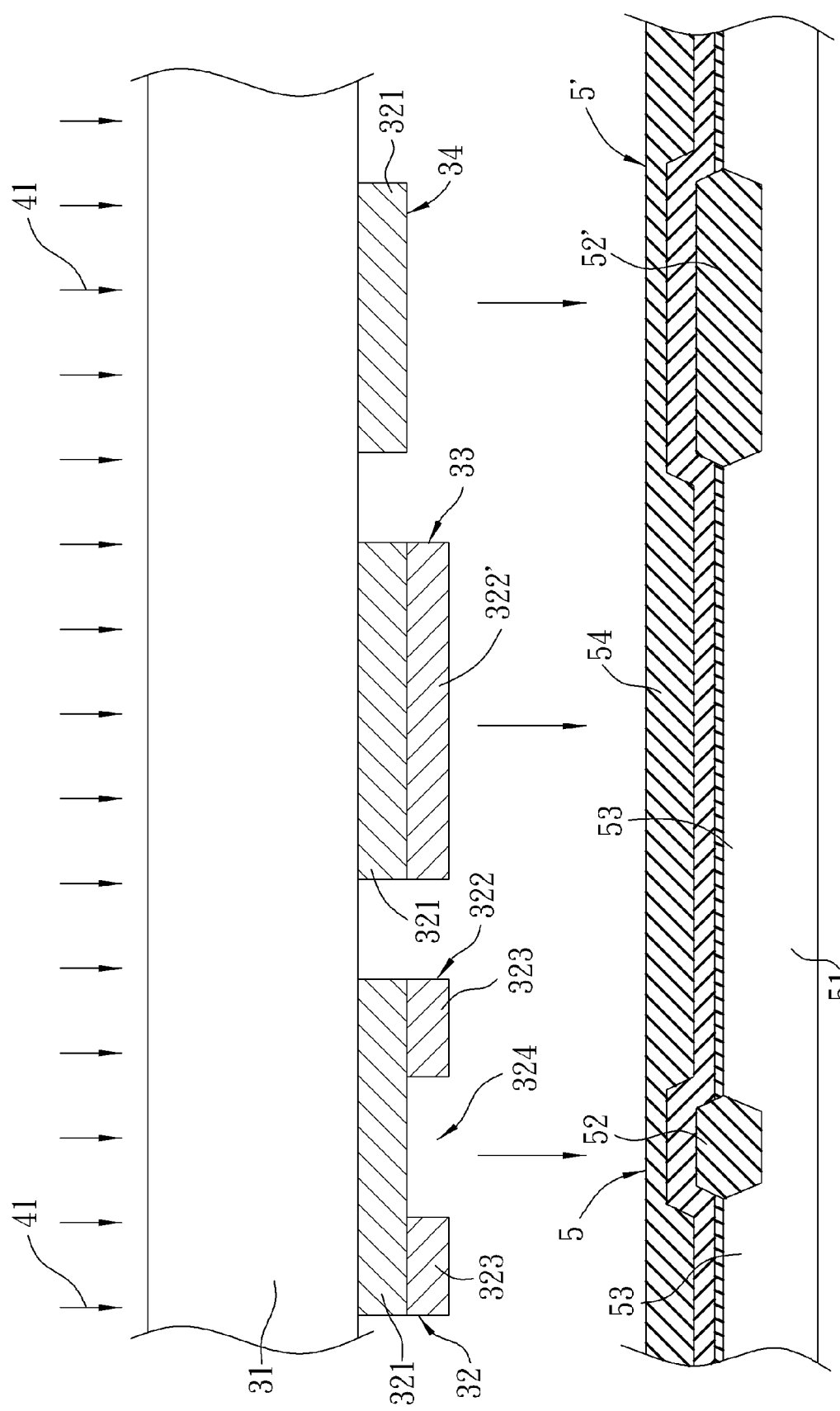
FIG. 4 is a fragmentary schematic view illustrating first photomask pattern units of the first preferred embodiment of the photomask used in patterning a photoresist layer in a trench isolation oxide region upon light exposure.

Referring to FIGS. 3 and 4, the first preferred embodiment of a photomask 3 of the present invention is used to form a gate electrode wiring crossing a trench isolation oxide region 5. The trench isolation oxide region 5 includes an oxide layer 52 that is embedded in and projects from a silicon substrate 51, and two active areas 53 disposed on the silicon substrate 51 and separated by the oxide layer 52. In this embodiment, the oxide layer 52 has a top surface which is higher than a surface of each of the active areas 53, and the height difference between the surface of the oxide layer 52 and the surface of each of the two adjacent active areas 53 is larger than 150 Å so that a photoresist layer 54 that is coated in the subsequent process will have different thicknesses due to the height difference between the oxide layer 52 and the two adjacent active areas 53. Since the trench isolation oxide region 5 is well known in the art, it will not be described in detail hereinafter.

The first preferred embodiment of the photomask 3 according to the present invention comprises a transparent substrate 31 for passage of an exposure light; and a plurality of first photomask pattern units 32 formed on a surface of the transparent substrate 31 (only one is shown in FIGS. 3 and 4), a plurality of second photomask pattern units 33 (only one is shown in FIGS. 3 and 4) formed on the surface of the transparent substrate 31 and spaced apart from the first photomask pattern units 32, and a plurality of third photomask pattern units 34 (only one is shown in FIGS. 3 and 4) formed on the surface of the transparent substrate 31 and spaced apart from the first and second photomask pattern units 32, 33. The transparent substrate 31 is made of quartz and permits the passage of the deep ultraviolet light.

Each of the first photomask pattern units 32 includes a first light-blocking layer 321 connected to the surface of the transparent substrate 31, and a second light-blocking layer 322 formed on a part of a first surface 327 of the first light-blocking layer 321 opposite to the transparent substrate 31, i.e., the first light-blocking layer 321 is not completely covered by the second light-blocking layer 322. The first light-blocking layer 321 is made of a material that can block the transmission of the exposure light source 41, for example, a chromium film, and includes a bottom surface 326 connected to the transparent substrate 31, and the first surface 327 opposite to the bottom surface 326. It is noted that the first light-blocking layer 321 of the photomask 3 may be formed with a structure composed of line/space or islands with different proximity and linearity. In this embodiment, at least one of the pitches between the patterns to be formed on the wafer is smaller than 140 nm, which is defined by the sum of the width of a line and the width of a space adjacent to the line. Since size of the photomask pattern is four times that of the pattern on the wafer, at least one of pitches defined by a sum of a width of the first photomask pattern unit 32 and a distance between two adjacent ones of the first pattern unit 32 is not larger than 560 nm. Preferably, at least one of the pitches is smaller than 560 nm. In addition, it should be noted that the design of the first light-blocking layer 321 can be corrected by combining with an auxiliary line or using an optical proximity correction technique.

The second light-blocking layer 322 also can block the transmission of the exposure light source 41, and has a second surface 329 connected to and parallel to the first surface 327 of the first light-blocking layer 321. In consideration of convenience, the material of the second light-blocking layer 322 may be selected to have an etching selection ratio different from that of the first light-blocking layer 321. For example, the material of the second light-blocking layer 322 may be TaN. That is, by selecting a suitable etchant, when the first light-blocking layer 321 is etched and patterned, the second light-blocking layer 322 may be used as a hard mask, and when the second light-blocking layer 322 is etched and patterned, the first light-blocking layer 321 can be used as an etching terminating layer. It should be noted that the material of the second light-blocking layer 322 can be the same as or different from that of the first light-blocking layer 321, for example, one of the first and second light-blocking layers is made from MoSi or the first and second light-blocking layer 321,322 are both made from chromium. In such case, etching time should be precisely controlled to form a desired wiring thickness and a three-dimensional configuration. The second light-blocking layer 322 includes two spaced apart protrusions 323 connected to and extending away from the first surface 327 of the first light-blocking layer 321. Since the critical dimension uniformity, the chromium thickness uniformity, the chromium edge profile, or the like must be controlled to be in a specific range, the thickness of the protrusions 323 ranges preferably from 5 to 200 nm. In addition, the two adjacent protrusions 323 define a recessed portion 324 therebetween.

Referring to FIG. 4, in this embodiment, the first photomask pattern units 32 correspond in position to the trench isolation oxide region 5 during a light exposure process. To be specific, during the light exposure process, the protrusions 323 are aligned with the photoresist layer 54 located on the active areas 53, and the recessed portions 324 are aligned with the photoresist layer 54 on the oxide layer 52. Thus, when the exposure light source 41 radiates the photomask 3, the interference of the light is changed due to the non-uniform thickness of the first photomask pattern units 32 attributed to the structure and arrangement of the first light-blocking layer 321 and the second light-blocking layer 322, thereby resulting in formation of focal planes which have different depths and which are respectively formed on a surface part of the photoresist layer 54 on the oxide layer 52 and another surface part of the photoresist layer 54 on the active areas 53. Therefore, light focuses on the respective surface parts of the photoresist layer 54 on the oxide layer 52 and on the active areas 53, thereby correcting the focus variation due to the poor flatness of the wafer surface. It should be noted that although, in this embodiment, the gate electrode wiring thus described crosses over one trench isolation oxide region 5, if the gate electrode wiring crosses over a plurality of trench isolation oxide regions 5, a plurality of the recess and projection structures of the second light-blocking layer 322 should be formed on the first light-blocking layer 321.

Figure 5:
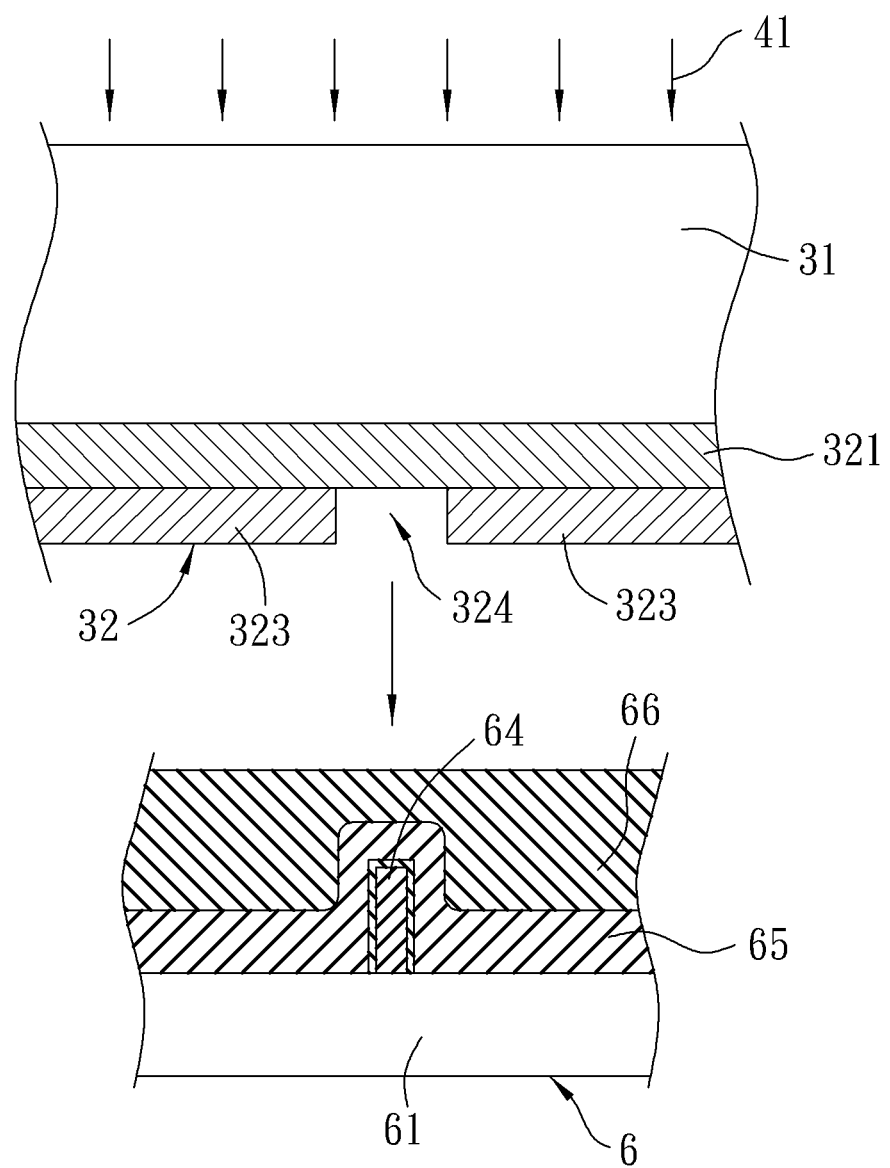
FIG. 5 is a fragmentary schematic view illustrating first photomask pattern units of the first preferred embodiment of the photomask used in patterning a photoresist layer in a Fin field effect transistor upon light exposure.

Referring to FIG. 5, the first photomask pattern units 32 may be used to form a gate electrode wiring of a Fin field effect transistor 6 (only one is shown in the drawing). The Fin field effect transistor 6 includes a substrate 61, a silicon active area 64 disposed on the substrate 61, a poly-silicon layer 65 formed on the substrate 61 and enclosing the silicon active area 64, and a photoresist layer 66 formed on an entire surface of the poly-silicon layer 65. In this embodiment, the height of the silicon active area 64 is larger than 150 Å. The poly-silicon layer 65 corresponding in position to the silicon active area has a relatively great height, such that the photoresist layer 66 on the silicon active area 64 has different thicknesses. During the manufacturing of the gate electrode of the Fin field effect transistor 6, the protrusions 323 are aligned with the photoresist layer 66 on two sides of the silicon active area 64, and the recessed portion 324 is aligned with the photoresist layer 54 formed on the oxide layer 52. Therefore, focal planes with different depths may also be formed using the first photomask pattern units 32 with different thicknesses, thereby correcting the focus variation due to the uneven surface height of the photoresist layer 66.

It should be noted that, in the first preferred embodiment, each of the first photomask pattern units 32 may include a third light-blocking layer (not shown) which can be disposed between the transparent substrate 31 and the first light-blocking layer 321, between the first and second light-blocking layers 321, 322, or on the second light-blocking layer 322 opposite to the first light-blocking layer 321. Preferably, the third light-blocking layer is disposed between the transparent substrate and the first light-blocking layer and functions as a phase-shifting layer to permit passage of an extremely less portion of the exposure light. The third light-blocking layer functions as a phase-shifting layer is made from MoSi having 6% transmittance. Alternatively, in addition to the two or three light-blocking layers, each of the first photomask pattern units 32 may include a phase-shifting layer (see the below third and fourth preferred embodiments).

Referring again to FIGS. 3 and 4, each of the second photomask pattern units 33 includes a first light-blocking layer 321 connected to the surface of the transparent substrate 31, and a second light-blocking layer 322' formed on the first light-blocking layer 321 opposite to the transparent substrate 31. The second photomask pattern units 33 may be used to form a focal plane on the photoresist layer 54 on the active areas 53 so as to facilitate the formation of the subsequent gate electrode.

Further, each of the third photomask pattern units 34 includes a first light-blocking layer 321 connected to the surface of the transparent substrate 31. The third photomask pattern units 34 have a smaller thickness relative to the thickness of the first and second photomask pattern units 32, 33. Therefore, the third photomask pattern units 34 can be used to form a focal plane on the photoresist layer 54 on a protruded oxide layer 52' in another trench isolation oxide region 5' so as to facilitate the formation of the subsequent gate electrode.

Figure 6:
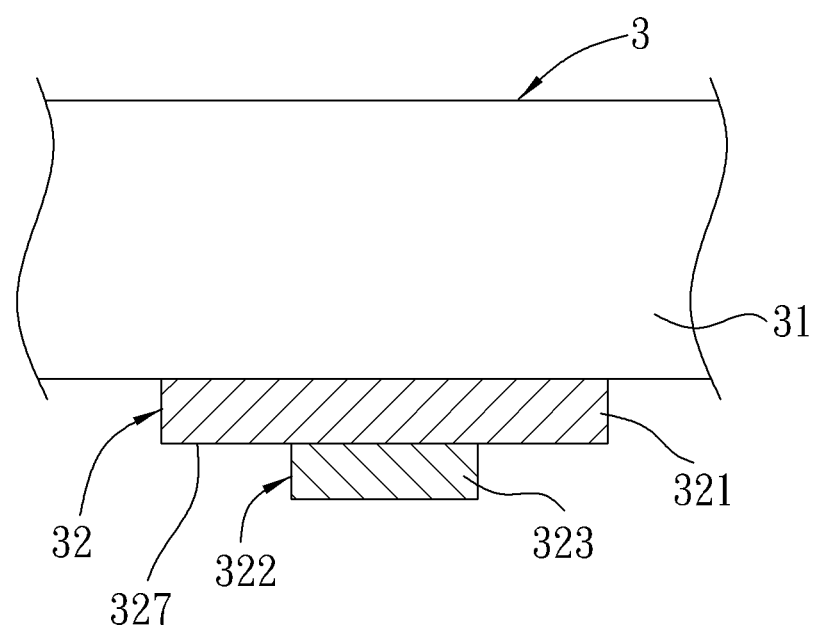
FIG. 6 is a fragmentary partly sectional view of the second preferred embodiment of a photomask according to the present invention.
Figure 7:
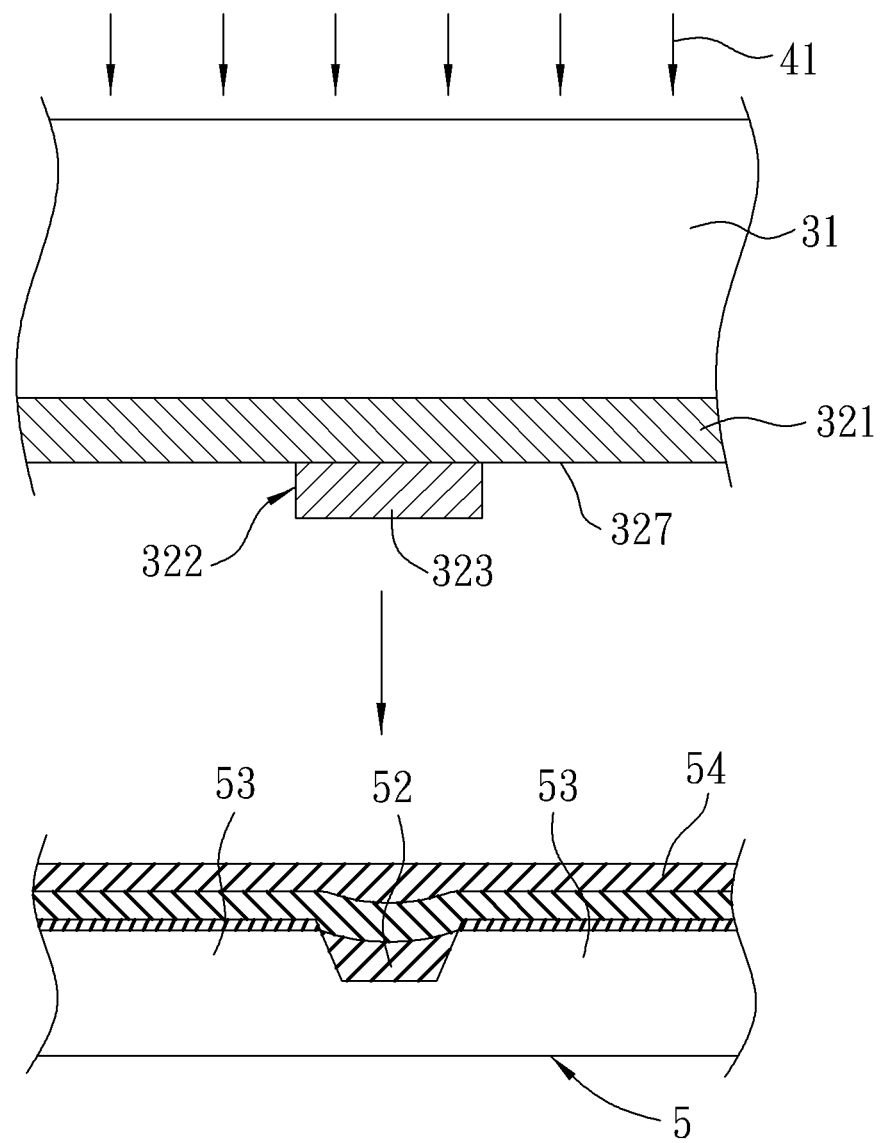
FIG. 7 is a fragmentary schematic view illustrating first photomask pattern units of the second preferred embodiment of the photomask used in patterning a photoresist layer in a trench isolation oxide region upon light exposure.

Referring to FIGS. 6 and 7, the second preferred embodiment of a photomask 3 of the present invention is used to correct the focusing on the oxide layer 52 in the trench isolation oxide region 5. The oxide layer 52 may be formed with a dishing surface and includes a central recessed region (see FIG. 7). The structure of the second preferred embodiment is similar to that of the first preferred embodiment, except that the second light-blocking layer 322 of each of the first photomask pattern units 32 includes a protrusion 323 connected to and extending away from the first surface 327 of the first light-blocking layer 321. The height difference between the central recessed region and the surface of the active areas 53 at two sides of the oxide layer 52 is 150 nm. The photoresist layer 54 thus has different thicknesses, i.e., thin (corresponding to the active areas 53)/thick (corresponding to the central recessed portion 324 of the oxide layer 52)/thin (corresponding to the active areas 53) structure. In this embodiment, the protrusion 323 is aligned with the central recessed portion upon light exposure so as to correct the exposure focusing. It should be noted that, to meet different requirements for producing chip wirings, the photomask pattern units of the first preferred embodiment and the second preferred embodiment can either be formed individually and respectively on different photomasks 3, or can be formed on the same photomask 3.

Similarly, in the second preferred embodiment, each of the first photomask pattern units 32 may include a third light-blocking layer (not shown), and one of the three light-blocking layers can be used as a phase-shifting layer. Alternatively, in addition to the two or three light-blocking layers, each of the first photomask pattern units 32 may include a phase-shifting layer (see the below third and fourth preferred embodiments).

Figure 8:
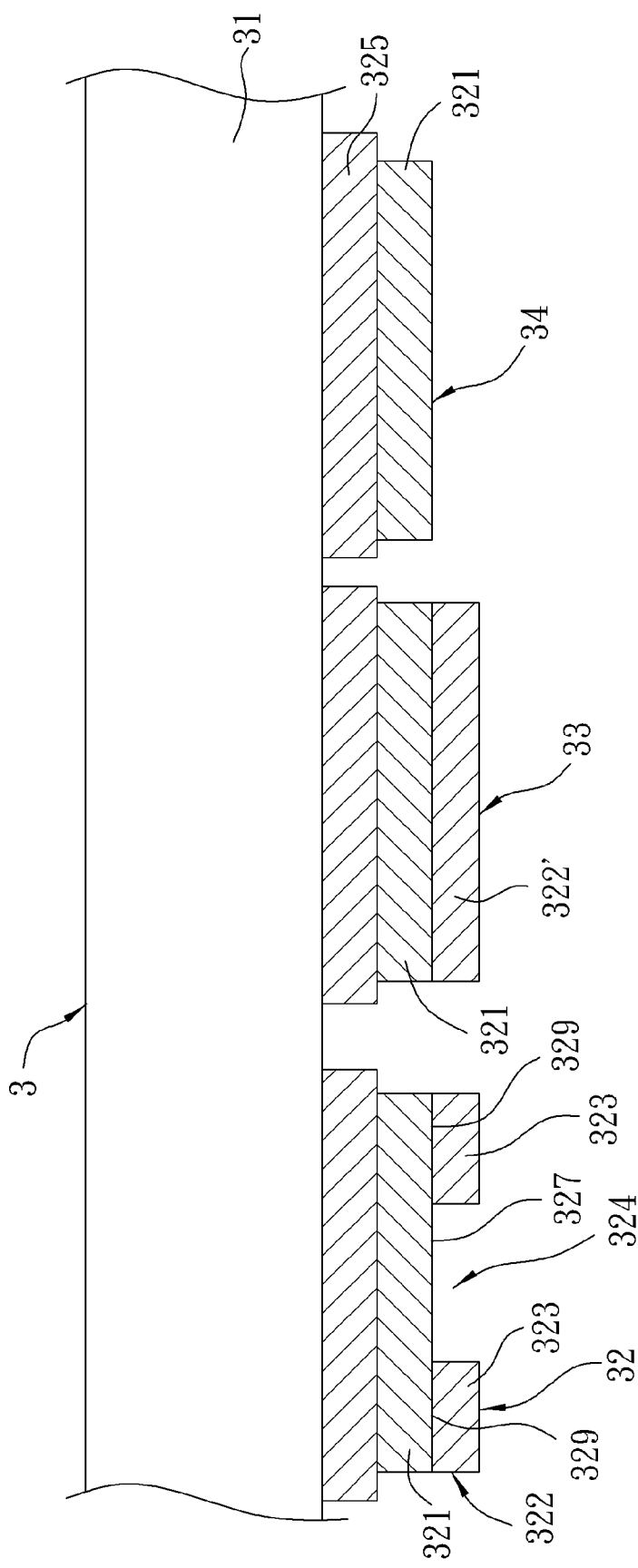
FIG. 8 is a fragmentary partly sectional view of the third preferred embodiment of a photomask according to the present invention.
Figure 9:
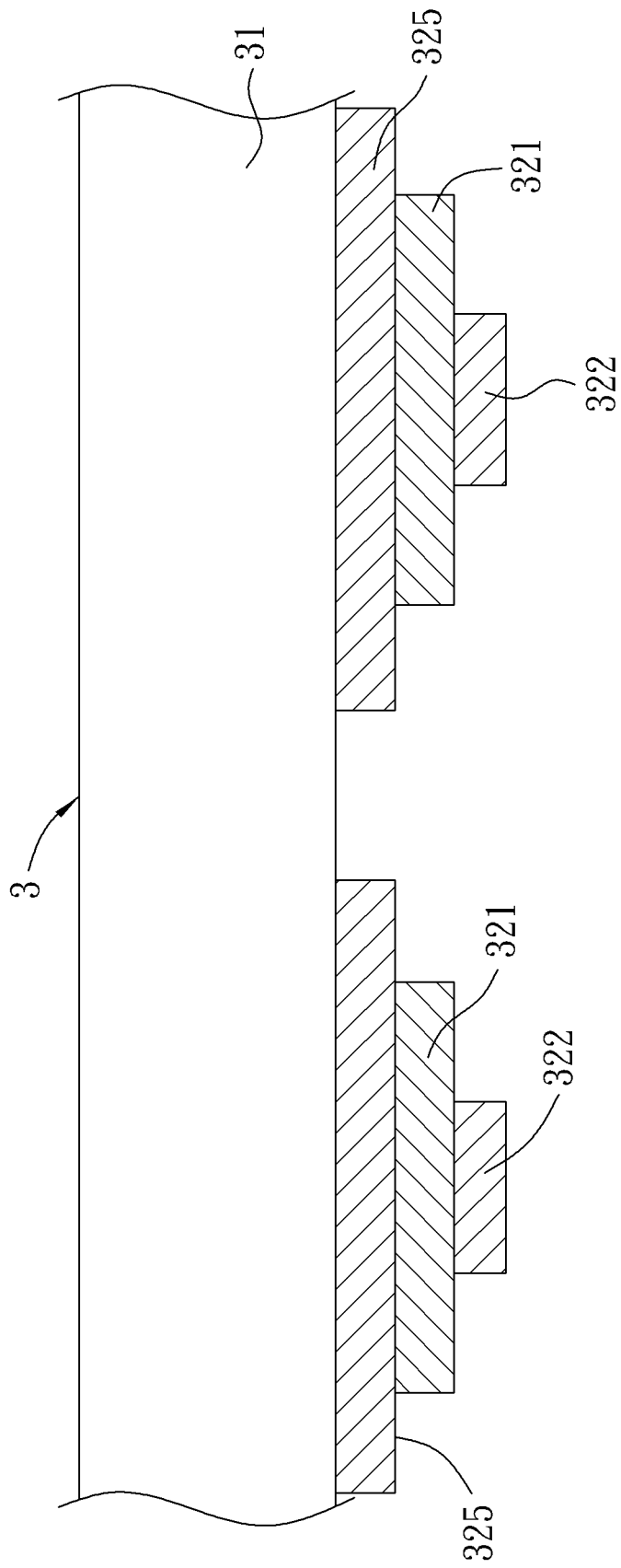
FIG. 9 is a fragmentary partly sectional view of the fourth preferred embodiment of a photomask according to the present invention.

Referring to FIGS. 8 and 9, the third and fourth preferred embodiments of a photomask 3 according to the present invention are similar to the first and second preferred embodiments except that each of the first photomask pattern units 32 further includes a phase shifting layer 325 disposed between the transparent substrate 31 and the first light-blocking layer 321 of the first photomask pattern unit 32 to permit passage of a portion of the exposure light. In these embodiments, the phase shifting layer 325 is made of a material of MoSi having 6% transmittance. That is, in addition to the binary mask, this invention can be applied to modify a structure of a phase shifting mask. Of course, in a similar manner, the phase shifting layer 325 may be provided in the second and/or third photomask pattern units 33, 34, and also exhibits light-blocking function since 6% transmittance of MoSi is lower than the threshold energy of the photoresist.

Figure 10:
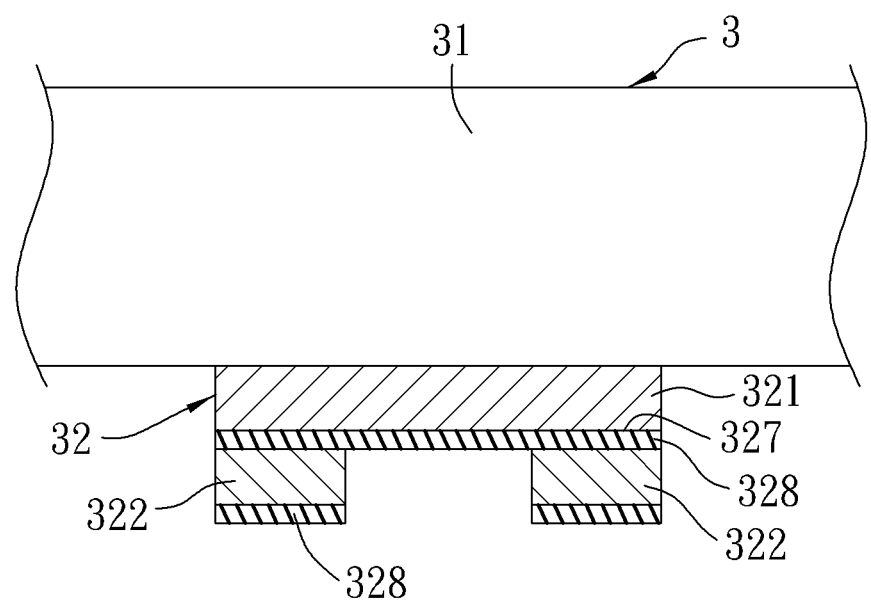
FIG. 10 is a fragmentary partly sectional view of the fifth preferred embodiment of a photomask according to the present invention.

Referring to FIG. 10, the fifth preferred embodiment of a photomask 3 according to the present invention is similar to the first preferred embodiment except that each of the first photomask pattern units further includes an anti-reflection layer 328 disposed on the first surface 327 of the first light-blocking layer 321 opposite to the transparent substrate 31, i.e., between the first light-blocking layer 321 and the second light-blocking layer 322, and an anti-reflection layer 328 formed on a surface of the second light-blocking layer 322 opposite to the first light-blocking layer 321. The anti-reflection layer 328 is made of a material of $Cr_2O_3$. It should be noted that the anti-reflection layer 328 may be either disposed between the first light-blocking layer 321 and the second light-blocking layer 322, or be disposed on the second light-blocking layer 322. Of course, in a similar manner, the anti-reflection layer 328 may be provided in the second and third photomask pattern units 33, 34 (not shown).

By virtue of the structural design of the first light-blocking layer 321 and the second light-blocking layer 322, the photomask 3 formed with light-blocking layers may have different thicknesses to correspond to the different thicknesses of the photoresist. Therefore, the photomask 3 can form different horizontal focal planes on the substrate (for example, on the trench isolation oxide region 5 or on the Fin field effect transistor 6) when an exposure light passes through the photomask 3 and can compensate for a defocus effect resulting from uneven surface height of the substrate.

Figure 11:
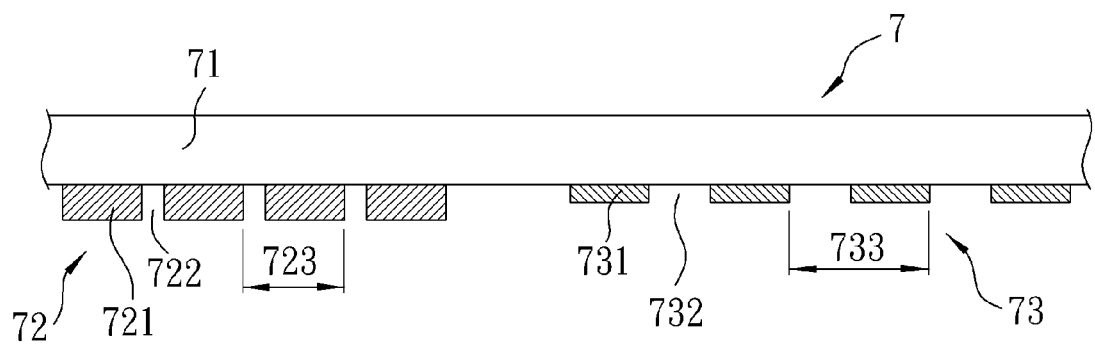
FIG. 11 is a fragmentary partly sectional view of the sixth preferred embodiment of a photomask according to the present invention.
Figure 12:
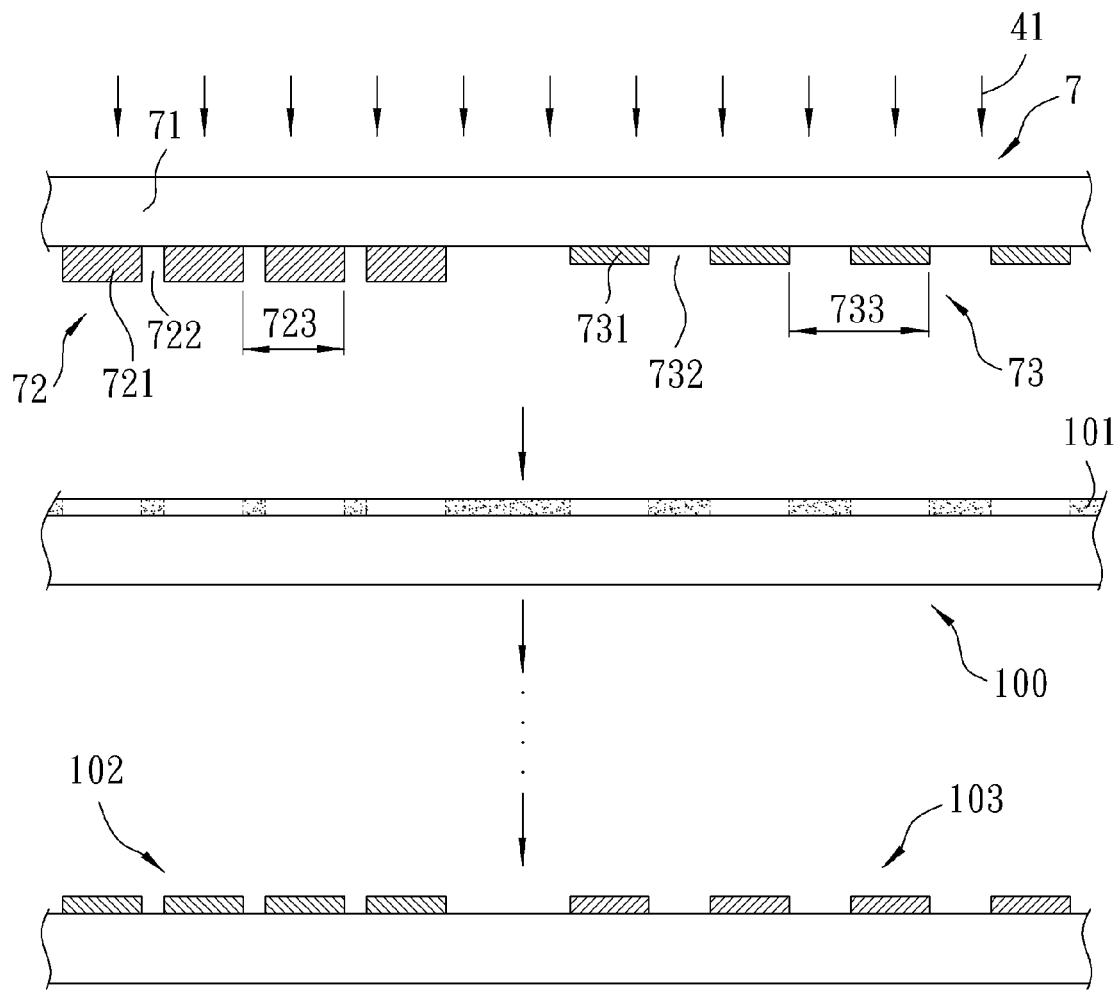
FIG. 12 illustrates consecutive steps for forming a photoresist pattern using the photomask of the sixth preferred embodiment.

Referring to FIGS. 2, 11 and 12, the sixth preferred embodiment of a photomask 7 of this invention is adapted for providing a photoresist layer 101 disposed on a substrate 100 with a predetermined photoresist pattern after light exposure. The photoresist pattern has at least one first wiring region 102 and at least one second wiring region 103. The first wiring region 102 is larger in wiring density than the second wiring region 103. It is noted that, in addition to the pattern shown in the drawing, the photomask 7 may be formed with a pattern of different proximity or linearity to meet design requirements for different elements.

The photomask 7 comprises a transparent substrate 71, at least one first photomask pattern unit 72, and at least one second photomask pattern unit 73.

The transparent substrate 71 is made of a material that permits passage of exposure light source 41 or that does not absorb the exposure light. In this embodiment, the transparent substrate 71 is made of quartz that permits the passage of deep ultraviolet.

The first photomask pattern unit 72 is disposed on a surface of the transparent substrate 71 for forming the first wiring region 102, and includes a plurality of first light-blocking regions 721 for blocking exposure light source 41 or for permitting passage of light energy lower than threshold energy of the photoresist layer 101, and a plurality of first light transmissive regions 722 alternating with the first light-blocking regions 721 for passage of exposure light source 41. The first photomask pattern unit 72 includes a plurality of first pattern pitches 723 each of which is defined by a sum of a width of one of the first light-blocking regions 721 and a width of an adjacent one of the first light transmissive regions 722.

The second photomask pattern unit 73 is disposed on the surface of the transparent substrate 71 corresponding in position to the second wiring region 103, and includes a plurality of second light-blocking regions 731 for blocking exposure light source 41 or for permitting passage of light energy lower than threshold energy of the photoresist layer 101, and a plurality of second light transmissive regions 732 alternating with the second light-blocking regions 731 for passage of exposure light source 41. The first and second light-blocking regions 721, 731 differ in thickness. The second photomask pattern unit 73 includes a plurality of second pattern pitches 733 each of which is defined by a sum of a width of one of the second light-blocking regions 731 and a width of an adjacent one of the second light transmissive regions 732. Each of the second pattern pitches 733 is at least twice larger than the first pattern pitch 723. Preferably, at least one the second pattern pitch 733 is not smaller than 560 nm.

The patterns of the first photomask pattern unit 72 and the second photomask pattern unit 73 of the photomask 7 are transferred to the photoresist layer 101 when the exposure light source 41 passes through the photomask 7. After post exposure baking and developing steps, the photoresist layer 101 formed with photoresist patterns having different wiring densities is thus formed. Therefore, by means of the thickness difference of the first light-blocking regions 721 and the second light-blocking regions 731, the photomask 7 is capable of forming different focal planes on the photoresist layer 101 upon light exposure to compensate for uneven resolution resulting from non-uniform density of the photoresist pattern and to improve an exposure process tolerance level. More specifically, the non-uniform density of the photoresist pattern results from the poor quality of the focus lens or different wiring densities. When the exposure light source 41 passes through the first and second light transmissive regions 722, 732, acid cations with different concentrations are generated at the same focal plane in the photoresist layer 101 due to the different diffusion extents of the acid cations during the subsequent post exposure baking step and the like.

It should be noted that the different thicknesses of the first light-blocking regions 721 and the second light-blocking regions 731 of the present invention can be used to compensate for uneven resolution resulting from non-uniform density of the photoresist pattern that exists in the conventional light-blocking region having uniform thickness. In this embodiment, the first light-blocking regions 721 are larger in thickness than the second light-blocking regions 731. Preferably, a difference in thickness between the first light-blocking regions 721 and the second light-blocking regions 731 is not smaller than 20 Å.

In addition, the photomask 7 may further comprise at least one third photomask pattern unit (not shown) formed on the transparent substrate 71 for forming in the photoresist layer 101 a third wiring region. The third photomask pattern unit includes a plurality of alternating third light-blocking regions and third light transmissive regions and has a third pattern pitch ranging between the first pattern pitch 723 and the second pattern pitch 733. That is, the third photomask pattern unit has a wiring density that ranges between a wiring density of the first photomask pattern unit 72 and a wiring density of the second photomask pattern unit 73. In addition, the third light-blocking regions have a thickness that ranges between a thickness of the first light-blocking regions 721 and a thickness of the second light-blocking regions 731. Therefore, the photomask 7 can be used to compensate for uneven resolution resulting from non-uniform density of the photoresist pattern by means of the different thicknesses of the light-blocking regions.

Further, when the substrate 100 of the photoresist layer 101 has first and second regions formed from different materials, the photomask 7 may further include at least one fourth photomask pattern unit and at least one fifth photomask pattern unit for respectively forming photoresist patterns (not shown) on the first and second regions. The fourth and fifth photomask pattern units respectively have fourth and fifth light-blocking layers for blocking exposure light or for permitting passage of light energy lower than an threshold energy of the photoresist layer. The fourth and fifth light-blocking layers have different thicknesses so as to be able to compensate for uneven resolution resulting from the different materials of the substrate.

The fourth light-blocking layer may be smaller in thickness than the fifth light-blocking layer. Alternatively, the fifth light-blocking layer may be smaller in thickness than the fourth light-blocking layer. Preferably, a difference in thickness between the fourth and fifth light-locking layers is not smaller than 20 Å.

Figure 13:
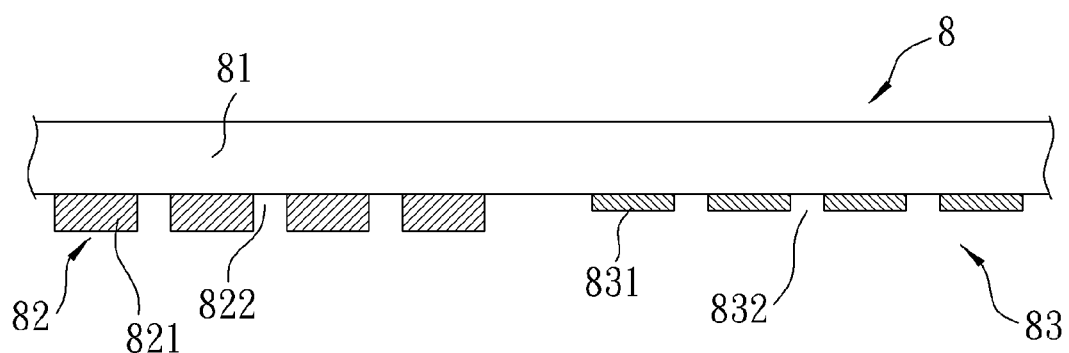
FIG. 13 is a fragmentary partly sectional view of the seventh preferred embodiment of a photomask according to the present invention.
Figure 14:
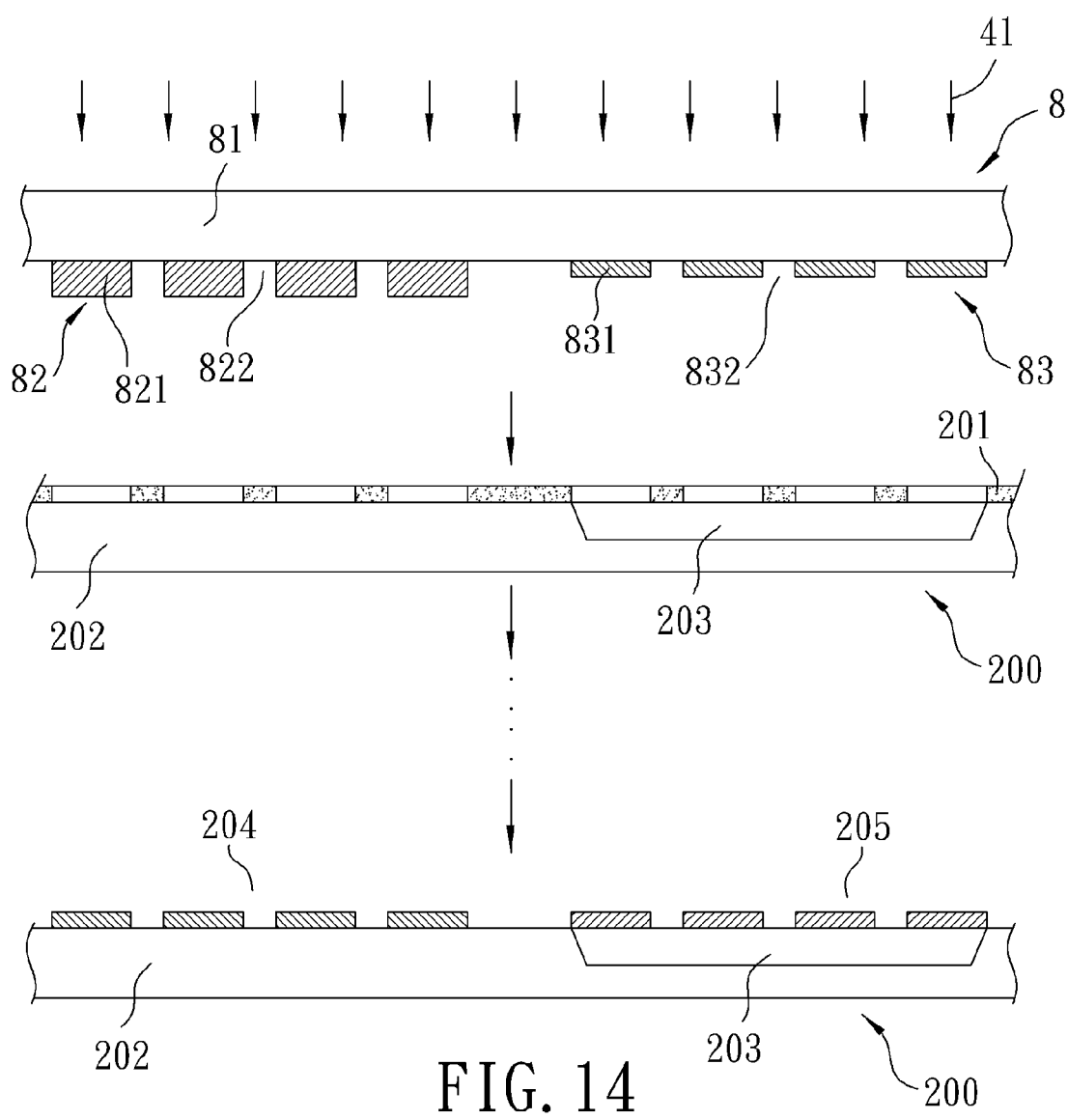
FIG. 14 illustrates consecutive steps for forming a photoresist pattern using the photomask of the seventh preferred embodiment.

Referring to FIGS. 2, 13 and 14, the seventh preferred embodiment of a photomask 8 according to the present invention is adapted for providing a photoresist layer 201 disposed on a photoresist substrate 200 with a predetermined photoresist pattern upon light exposure. The substrate 200 has first and second regions 202, 203 formed from different materials, and the photoresist layer 201 covering the first region 202 and the second region 203. In this embodiment, the first region 202 is made of silicon, and the second region 203 is made of an oxide such as silicon oxide.

The photomask 8 comprises a transparent substrate 81, at least one first photomask pattern unit 82, and at least one second photomask pattern unit 83.

The transparent substrate 81 is made of a material that permits passage of exposure light source 41 or that does not absorb the exposure light. In this embodiment, the transparent substrate 81 is made of quartz that permits the passage of deep ultraviolet.

The first photomask pattern unit 82 is disposed on a surface of the transparent substrate 81 corresponding in position to the first region 202 for forming a first wiring region, and includes a plurality of first light-blocking regions 821 for blocking exposure light source 41 or for permitting passage of light energy lower than threshold energy of the photoresist layer 201, and a plurality of first light transmissive regions 822 alternating with the first light-blocking regions 821 for passage of exposure light source 41.

The second photomask pattern unit 83 is disposed on the surface of the transparent substrate 81 corresponding in position to the second region 203 for forming a second wiring region, and includes a plurality of second light-blocking regions 831 for blocking exposure light source 41 or for permitting passage of light energy lower than threshold energy of the photoresist layer 201, and a plurality of second light transmissive regions 832 alternating with the second light-blocking regions 831 for passage of exposure light source 41. The first and second light-blocking regions 821, 831 differ in thickness. In this embodiment, the first light-blocking regions 821 are larger in thickness than the second light-blocking regions 831. Preferably, a difference in thickness between the first light-blocking regions 821 and the second light-blocking regions 831 is not smaller than 20 Å.

The patterns of the first photomask pattern unit 82 and the second photomask pattern unit 83 of the photomask 8 are transferred to the photoresist layer 201 when the exposure light source 41 passes through the photomask 8. After post exposure baking and developing steps, the photoresist layer 201 formed with different photoresist patterns 204, 205 corresponding in position to the first and second regions 202, 203 is obtained. Therefore, by means of the thickness difference of the first light-blocking regions 821 and the second light-blocking regions 831, the photomask 8 is capable of forming different focal planes in the photoresist layer 201 upon light exposure to compensate for defects resulting from the different materials of the photoresist substrate 200 and to improve an exposure process tolerance level. More specifically, the different materials of the photoresist substrate 200 result in different heat-conduction or reflection properties that cause different heat transfer properties during the post exposure baking process, thereby affecting the diffusion capability of acid cations and resulting in the non-uniform photoresist patterns 204, 205 formed on the first and second regions 202, 203. That is, by virtue of the thickness difference of the first light-blocking regions 821 and the second light-blocking regions 831, the non-uniformity of photoresist patterns 204, 205 formed on the first and second regions 202, 203 can be eliminated.

To sum up, by virtue of different heights in the photomask pattern, the photomask of the present invention can precisely adjust the distance between the photomask and the projection lens in order to produce focal planes of different depths, thereby compensating for the exposure difference resulting from uneven surface height of the substrate, non-uniform density of the photoresist pattern or the different materials of the substrate and improving the exposure process tolerance level.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A photomask for providing a photoresist layer disposed on a substrate with a predetermined photoresist pattern upon light exposure, the photoresist pattern having at least one first wiring region and at least one second wiring region, the first wiring region being larger in wiring density than the second wiring region, the photomask comprising:
    a transparent substrate;
    at least one first photomask pattern unit disposed on a surface of said transparent substrate for forming the first wiring region, and including a plurality of first light-blocking regions for blocking exposure light or for permitting passage of light energy lower than threshold energy of the photoresist layer, and a plurality of first light transmissive regions alternating with said first light-blocking regions for passage of exposure light; and
    at least one second photomask pattern unit disposed on a surface of said transparent substrate corresponding in position to the second wiring region, and including a plurality of second light-blocking regions for blocking exposure light or for permitting passage of light energy lower than threshold energy of the photoresist layer, and a plurality of second light transmissive regions alternating with said second light-blocking regions for passage of exposure light;
    wherein said first and second light-blocking regions differ in thickness.

2. The photomask of claim 1, wherein said first light-blocking regions are smaller in thickness than said second light-blocking regions.

3. The photomask of claim 1, wherein said second light-blocking regions are smaller in thickness than said first light-blocking regions.

4. The photomask of claim 1, wherein a difference in thickness between said first light-blocking regions and said second light-blocking regions is not smaller than 20 Å.

5. The photomask of claim 1, wherein the second photomask pattern unit includes a plurality of second pattern pitches each of which is defined by a sum of a width of one of said second light-blocking regions and a width of an adjacent one of said second light transmissive regions, at least one of said second pattern pitches being not smaller than 560 nm.

6. The photomask of claim 5, wherein one of said first light-blocking regions and an adjacent one of said first light transmissive regions define a first pattern pitch, said second pattern pitch being at least twice larger than said first pattern pitch.

7. The photomask of claim 1, further comprising at least one third photomask pattern unit formed on said transparent substrate for forming in the photoresist layer a third wiring region, the third wiring region being smaller in wiring density than the first wiring region and being larger in wiring density than the second wiring region, said third pattern unit including a plurality of alternating third light-blocking regions and third light transmissive regions and having a third pattern pitch ranging between the first pattern pitch and the second pattern pitch, said third light-blocking regions having a thickness that ranges between a thickness of said first light-blocking regions and a thickness of said second light-blocking regions.

8. The photomask of claim 1, wherein the substrate of the photoresist layer has first and second regions formed from different materials, the photomask further comprising at least one fourth photomask pattern unit and at least one fifth photomask pattern unit for respectively forming photoresist patterns on the first and second regions, said fourth and fifth photomask pattern units respectively having fourth and fifth light-blocking layers for blocking exposure light or for permitting passage of light energy lower than an threshold energy of the photoresist layer, said fourth and fifth light-blocking layers having different thicknesses.

9. The photomask of claim 8, wherein a difference in thickness between said fourth and fifth light-locking layers is not smaller than 20 Å.

* * * * *